United States Patent

[11] 3,634,600

[72] Inventors William F. Griffin Summit; Alfred Morena, Jr., North Plainfield, both of N.J.

[21] Appl. No. 843,382

[22] Filed July 22, 1969

[45] Patented Jan. 11, 1972

[73] Assignee Ceramic Metal Systems, Incorporated South Somerville, N.J.

[54] CERAMIC PACKAGE
12 Claims, 4 Drawing Figs.

[52] U.S. Cl. .......... 174/52 S, 29/588, 29/626, 174/DIG. 3, 174/68.5, 317/101 CP, 317/234 G

[51] Int. Cl. .......... H05k 5/00

[50] Field of Search .......... 174/52.5, 52.6, 68.5; 317/101 CM, 101 A, 101 CP, 101 D, 234; 29/625, 626, 598–590, 577

[56] References Cited

UNITED STATES PATENTS

| | | | |
|---|---|---|---|
| 3,040,213 | 6/1962 | Byer et al. | 29/625 X |
| 3,189,978 | 6/1965 | Stetson | 317/101 CM UX |
| 3,264,402 | 8/1966 | Shaheen et al. | 174/68.5 |
| 3,364,300 | 1/1968 | Bradham | 174/68.5 |
| 3,378,920 | 4/1968 | Cone | 29/625 |
| 3,497,947 | 3/1970 | Ardezzone | 174/52 (.5) X |

FOREIGN PATENTS

| | | | |
|---|---|---|---|
| 253,951 | 8/1964 | Australia | 174/DIG. 3 |

*Primary Examiner*—Darrell L. Clay
*Attorney*—Herbert M. Shapiro

ABSTRACT: A ceramic package bearing an electrically conducting pattern and adapted to receive diminutive electronic components such as semiconductor elements includes metallic plugs in the conducting pattern to serve as islands to which internal lead connections to the semiconductor element are made. The plugs permit a high degree of flexibility in material selection for contact areas providing different metals without costly selective plating techniques. The resulting structure can be fabricated without any gold plating steps. Similar plugs may be used as islands to which external leads are connected.

CERAMIC PACKAGE

FIELD OF THE INVENTION

This invention relates to packages for diminutive electronic components and more particularly to laminate ceramic packages including structured metallized layers and adapted to receive semiconductor or integrated circuits and the like.

BACKGROUND OF THE INVENTION

Microelectronic components have become so inexpensive that the cost of the encapsulation for a component may exceed the cost of the component. One reason for this is that the component usually requires encapsulation in a controlled environment. To achieve this environment, contacts to the component are not only electrically isolated one from the other but also are formed in a manner to permit a hermetic seal to be made when the component is later encapsulated. Another reason is the high cost of handling such minute elements. To reduce this latter problem, encapsulating packages usually include electrical conductors in a sunburst pattern, the conductors radiating from a reduced area adapted to receive the microelectronic component.

Ceramic packages are well known in the art to be highly suited for encapsulating such components because they not only facilitate handling but also provide the requisite hermetic seals competitively. Typically, such structures are formed from layers of plasticized green ceramic which are metallized in accordance with prescribed patterns, stacked and fired. The result is a rigid ceramic package including a structured conducting surface to proximate ends of which delicate leads from the semiconductor element are connected and to remote ends of which sturdy external leads are connected.

But ceramic packages are still costly due, to a large extent, to a required gold plating. Typically, the conducting surface of a finished ceramic package is gold plated to avoid oxidation of an underlying base metal and to form preferred bonding surfaces. High-quality bonds, however, require gold platings in excess of a minimum thickness to prepare the surface adequately; it has become necessary to provide thicker and thicker platings to satisfy more and more stringent specifications. Naturally, the more gold that is used, the higher the cost. The most inexpensive plating procedures moreover result in the plating of all exposed metal parts compounding the problem. On the other hand, to localize the plating would require costly photolithographic techniques. An impass exists. As a result, costs appear irreducible unless suitable contact areas are achieved in a structure in which gold plating can be localized without photolithographic techniques or eliminated altogether.

Accordingly, objects of this invention are to provide a package for an electronic component in which contact areas are localized and a process for making such a structure in the absence of photolithographic techniques.

Recent technological developments make it convenient to package a plurality of different devices in a single package imposing even further requirements on a ceramic package. These elements may include capacitors and resistors as well as semiconductors. Different elements usually require different kinds of metals for effecting lead connections because of, for example, different coefficient of expansion requirements. A typical package, accordingly, would include several different metals in the structured conducting surface to which lead connections are made. But to realize such a structure, once again costly selective deposition techniques are required.

Some such devices even preclude the use of gold platings. For example, when radiation resistive surfaces are required, an aluminum bonding surface is most appropriate. But aluminum can't be plated. Also, for devices which are radiation resistant, gold cannot be used. Accordingly, in many instances, preferably plated multimetal bonding surfaces not only are costly but also unrealizable.

A further problem then is not only to localize inexpensively or eliminate the necessity for gold plating in a ceramic package but to do so with a structure and process in which multimetal bonding surfaces can be realized inexpensively.

Accordingly, another object of this invention is to provide a ceramic package in which bonding surfaces of different materials are realized inexpensively.

BRIEF DESCRIPTION OF THE INVENTION

The invention is based on the recognition that the requirements for a high-quality bonding surface need be met only in restricted areas of a conductive path in a ceramic package. An apertured ceramic layer overlying a metallized sunburst pattern to which internal lead connections are normally bonded and exposing only portions of the proximate ends of that pattern not only defines such localized bonding surfaces but does so in a manner which eliminates the need for an expensive noble metal (i.e., gold) overlay and also permits processing cost reduction by taking advantage of techniques which facilitate the formation of contact surfaces of different metals. On this score, fired ceramic packages including an apertured ceramic overlay, in accordance with this invention, have those apertures threaded by conducting wires which are diced and swaged by mass production techniques to form conducting plugs in the apertures. The result is the elimination of the costly large area gold overlay and the formation of contact islands having thicknesses sufficient to permit mechanical bonding thereto. Internal lead connections are bonded directly to the plugs in accordance with well-known techniques.

The surface of the plug may be coated to protect against oxidation or alternatively the entire plug may be of gold. In another arrangement, plugs are made in the metallized sunburst pattern directly without the apertured ceramic overlay.

Accordingly, a feature of this invention is a ceramic package including a structured conducting surface and an overlay of ceramic including metallized plugs at proximate ends of the conducting surface for receiving lead connections.

Another feature of this invention is a ceramic package comprising a structured conducting surface including metallic plugs.

DETAILED DESCRIPTION

Figure 1:
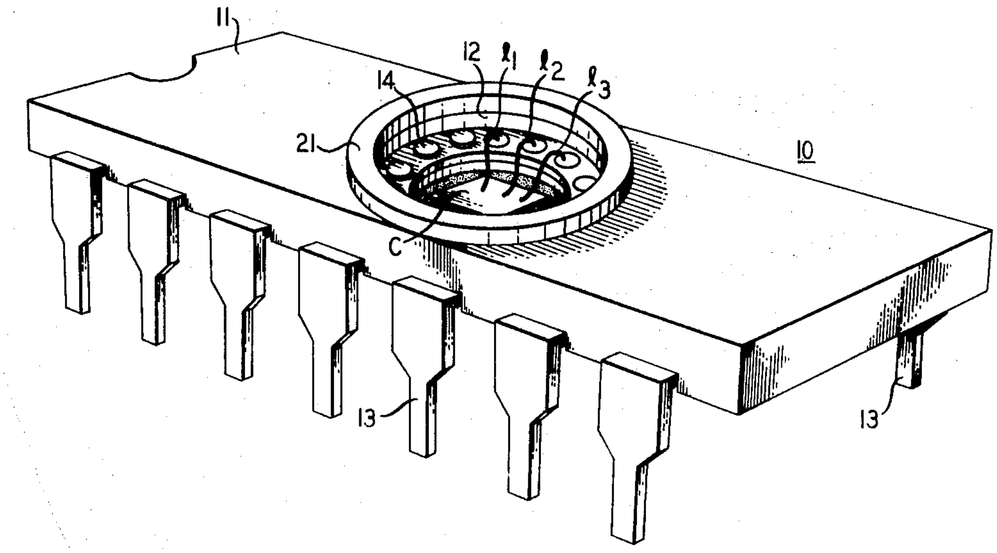
FIG. 1 is a plan view of a ceramic package in accordance with the invention.

FIG. 1 shows a ceramic package 10 in accordance with this invention. The package includes a ceramic body 11 within which an area 12 is defined for receiving a semiconductor chip C. Lead wires $\gamma_1$, $\gamma_2$, ...$\gamma_n$ are connected, in accordance with well-understood considerations, between the semiconductor ship and selected ones of a plurality of external leads 13 shown in the figure. The connections to leads 13, however, are through plugs 14 in accordance with this invention.

Figure 2:
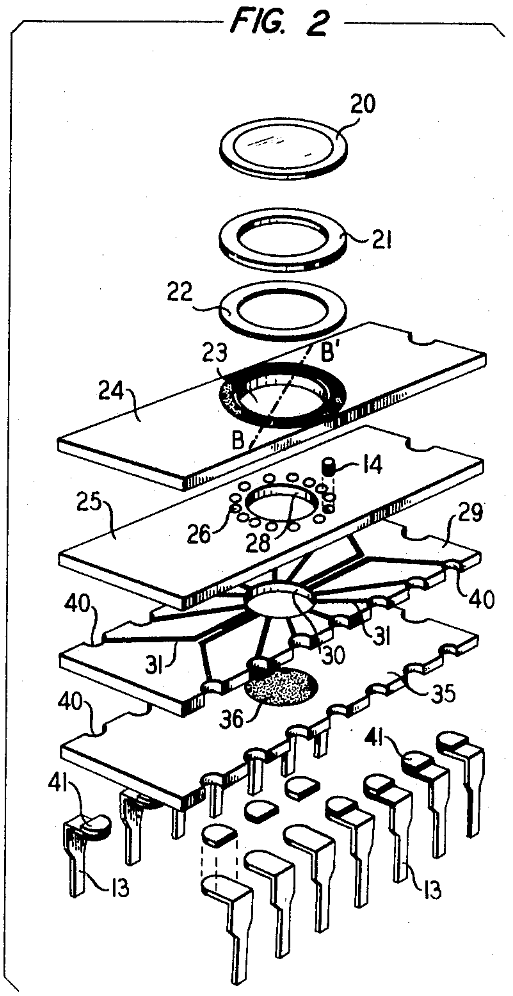
FIG. 2 is an exploded view of the package of FIG. 1.

FIG. 2 shows the package of FIG. 1 in an exploded view which permits the invention to be visualized fully. Area 12 can be seen to be defined partially by a Kovar cap 20 along with Kovar flange 21 and braze preform 22. These elements (except cap 20) are mated with aperture 23 of a green alumina laminate 24 during fabrication of the package.

A second green alumina laminate 25 includes a plurality of apertures 26 disposed about a central aperture 28. Aperture 28 can be seen to have a diameter smaller than that of aperture 23. Apertures 26 are plugged by plugs 14 of FIG. 1 after assembly and firing as is discussed further hereinafter. Laminate 25 is stacked in registry with laminate 24 as is clear from FIG. 2.

A third green alumina laminate 29, adjacent laminate 25, also includes a central aperture 30. Laminate 29 bears an illustrative electrically conducting sunburst pattern 31, each line of which includes an end proximate aperture 30 and an end remote from that aperture. It is to be understood that the term "sunburst" is used generically herein to designate any pattern which effects an enlargement of a contact area for achieving suitable lead connection and is not restricted to a radial arrangement of conductors as shown in FIG. 2.

A fourth green alumina laminate 35, including a metallized area 36, provides the support for the semiconductor chip and thus completes the element receiving area 12 of FIG. 1.

Laminate 35, as well as laminate 29, also includes illustratively peripheral recesses 40 which are metallized to provide conducting paths through those laminates to leads 13. These leads are attached to laminate 35 in a manner to seat against metallized (metal filled) recesses 40 for providing a relatively large area contact surface. Typically, braze preforms 41 are included to secure the bond therebetween.

The various laminae are stacked and fired at a temperature of above 3,000° F for about one hour to form a rigid structure with apertures 26 of laminate 25 of FIG. 2 unfilled. Plugs 14 are added thereafter.

Figure 3:
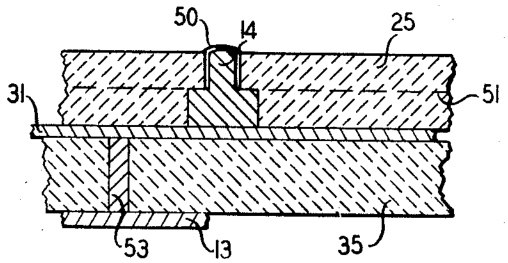
FIG. 3 is a cross section of a portion of the package of FIG. 1.

A plug 14 may take a variety of forms in accordance with this invention. FIG. 3 shows a cross section through package 10 along line B—B′ of FIG. 2 illustrating in cross section a plug 14 in accordance with one aspect of this invention. Plug 14, in this instance, is seen to have an upside-down T-shape, as viewed, which provides an anchor for the plug in the finished package. A metallized connection between an encapsulated element (*c*) and an external lead is realized through plug 14, metal layer 31, through metallized aperture 40 to Kovar leads 13 shown in FIG. 2.

Simple wire threading techniques produce plugs for ceramic packages herein. In practice, the apertures 26 of alumina laminate 25, as shown in figs. 1 and 2, are threaded with conducting wires which are first cut and then swaged in place by any suitable forming tool to form the requisite plugs 14 as shown in fig. 2. If it is desired to anchor plugs 14, as shown in FIG. 3, each laminate 25 is made in two layers, indicated by broken line 51 in FIG. 3, where one layer includes apertures 26 having diameters larger than those of the mating layer. Annealed conducting wire is sufficiently malleable to fill the large diameter to provide an anchored plug.

The exposed end of each plug 14 is shown coated by a gold layer 50, illustratively, to avoid oxidation prior to the formation of internal lead connection and the ultimate encapsulation effected by securing cap 20 of FIG. 2 in place in a suitable atmosphere. Such a coating may be provided by familiar barrel-plating techniques if required.

Alumina laminate 35 (viz: recesses 40) may be plugged similarly by a simple or anchored plug in the manner of plugs 14 of laminate 25. One such simple plug is shown at 53 in FIG. 3 as a substitute for the metallized recesses 40 and can be seen to be spaced from the edge of layer 35. These plugs may be provided as are plugs 14 or by riveting techniques which supply the plug material and produce the lead connection simultaneously.

A structure of the type described is known to permit a high-grade hermetic seal when Kovar cap 20 is secured in place over an encapsulated element, because of the quality of the ceramic to metal seal produced in the firing process. In accordance with this invention a structurally rigid plug 14 is provided, in addition, forming a localized bonding surface in the absence of photolithographic techniques for attaching internal lead connections mechanically. At the same time, familiar wire-threading technique, adapted for forming the plugs (contact islands), permits the use of wire of any suitable material thus allowing a considerable flexibility in the material of these islands.

It may be appreciated that it is desirable for the plugs to provide a particularly rigid contact area to which internal lead connections can be bonded. Such bonding is normally carried out by what is commonly known as thermal-compression bonding, a procedure which by its name indicates the use of pressure. In accordance with this invention, the thickness of a contact island (plug) permits mechanical bonding at even higher pressures. A secure and rigid contact island is a necessity. Yet it is difficult to realize at the dimensions contemplated. Rigidity is ensured in accordance with this invention by forming each island in a ceramic aperture which acts as a supporting sleeve.

A recitation of the contemplated dimensions underscores the difficulty in achieving a contact surface of suitable rigidity. Typically, a plug 15 of FIG. 2 has an exposed surface with a diameter of about 20 mils. Laminate 25 (and thus plug 14) has a total thickness of about 20 mils also.

The encapsulation step is carried out in a reducing gas atmosphere and under pressure in accordance with well-understood considerations.

Figure 4:
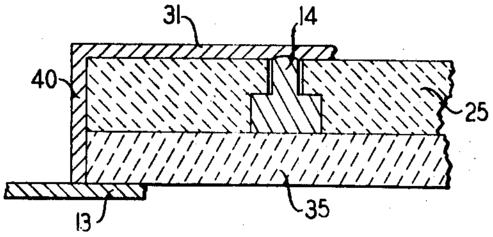
FIG. 4 is a portion of an alternative arrangement in accordance with this invention.

FIG. 3 shows plug 14 serving in the conducting path between the semiconductor element and the external leads. It is important to understand that in accordance with this invention this need not be the case. The prime function of plug 14 is to provide an additional degree of freedom in the provision of contact surfaces for electrical connections. This is emphasized in FIG. 4 where plug 14 is seen to terminate at ceramic layer 35 thus precluding an electrical path through it. The plug in this instance serves as a contact island. The conducting path instead is through pattern 31 and metallized apertures 40. The use of plug 14 permits lead bonding by means of a mechanical connection at the point where the plug 14 meets pattern 31 without photolithographic techniques.

In the absence of the plug, in accordance with this invention, a sintered metal contact surface is required and that surface must be plated to permit brazing material to wet it. A brazing operation is necessary to complete the bond. When plug 14 is used, the resulting mechanical bond, of course, does not require overlay 50 of FIG. 3 even if the plug is not of gold.

If a structure should require gold plating of any one-piece part, it is just as inexpensive to plate all exposed base metal piece parts. Perhaps even less expensive because selective plating would then be unnecessary. Typically, a ceramic package is in the form shown in FIG. 1, without cap 20, metal hardware or component C when a gold-plating operation is carried out. Leads 13 are brazed prior to gold plating to avoid gold diffusion which reduces the thickness of the plating. Consequently, substantial area are plated. If plugs, in accordance with this invention, are used in ceramic layer 35 as shown in FIG. 3, leads 13 can be bonded to the plugs after the gold-plating step is carried out thus reducing the area plated if plating is desired. It is emphasized, however, that gold plating may be eliminated entirely by the use of plugs in accordance with this invention. The finished structure with leads 13 connected may be solder dipped to facilitate any further electrical connections.

The invention has been described in terms of specific ceramic and metallized layers, electrically insulating and conducting respectively. It is to be understood, nevertheless, that alternative materials are well known as suitable for these purposes and may be substituted.

What has been described is considered only illustrative of the principles of this invention. Accordingly, many and various modifications can be devised by those skilled in the art in accordance with those principles within the spirit and scope of this invention.

What is claimed is:

1. A subassembly for the encapsulation of an electronic component comprising a monolithic structure including a first electrically insulating layer, a centrally located first area in said layer, a sunburst pattern of electrical conductors overlying said layer, each of said conductors including ends proximate and remote with respect to said central area, a second electrically insulating layer juxtaposed with said first layer and including a plurality of first apertures each disposed to correspond to the proximate end of an associated one of said conductors, each of said first apertures including an electrically conducting plug having a first surface in electrical contact with an associated conductor, said second insulating layer overlying said sunburst and including a centrally located aperture sufficiently large to expose said first area, and means encompassing said first apertures for forming a bearing surface for sealing to a cover spaced apart from said first aperture.

2. A subassembly in accordance with claim 1 wherein each of said electrically insulating layers comprises a ceramic material.

3. A subassembly in accordance with claim 2 wherein said first electrically insulating layer includes a centrally disposed aperture having a first diameter, said package also including a third electrically insulating layer bearing an electrically conducting overlay disposed adjacent said first insulating layer to correspond to said centrally disposed apertures, and said means encompassing said first apertures including a fourth electrically insulating layer disposed adjacent said second insulating layer, said last-mentioned layer including a centrally disposed aperture having a diameter larger than said first diameter for exposing said first apertures, said fourth insulating layer being adapted for receiving a cover and electrically conducting leads attached to said remote ends of said electrically electrical conductors.

4. A subassembly in accordance with claim 1 wherein said first surface of each of said plugs is coated by an electrically conducting, oxidation-resisting plating.

5. A subassembly in accordance with claim 4 wherein said plating comprises gold.

6. A subassembly in accordance with claim 1 wherein each of said plugs comprises gold.

7. A subassembly in accordance with claim 1 wherein each of said first surfaces if of reduced geometry.

8. A subassembly in accordance with claim 1 wherein said plugs comprise materials different from one another.

9. A subassembly in accordance with claim 1 wherein said first electrically insulating layer also includes a plurality of apertures each associated with a different one of said remote ends.

10. A subassembly in accordance with claim 9 wherein each of said last-mentioned apertures includes an electrically conducting plug.

11. A subassembly for a ceramic package comprising a monolithic structure including a first ceramic layer having first and second surfaces, said layer having a first centrally located aperture therethrough, an electrically conducting sunburst pattern on said first surface having ends proximate and remote with respect to said aperture, said layer including a plurality of holes in the proximate ends of said sunburst pattern and metallic plugs in said holes, said subassembly also including an additional ceramic layer having a second centrally disposed aperture larger than said first for exposing said plugs, and an electronic element having a plurality of active areas therein, said element being positioned within said centrally located apertures and having wire connections between said active areas and different ones of said plugs.

12. A subassembly in accordance with claim 11 including a third ceramic layer contiguous said second surface.

* * * * *